United States Patent
Suzuki et al.

(10) Patent No.: US 8,654,481 B2
(45) Date of Patent: Feb. 18, 2014

(54) MAGNETIC DISK INSPECTING METHOD AND ITS SYSTEM

(75) Inventors: Ryuta Suzuki, Kamisato (JP);
Masayuki Yamamoto, Kamisato (JP);
Toshiaki Sugita, Kamisato (JP)

(73) Assignee: Hitachi High-Technologies Corporation, Tokyo (JP)

( * ) Notice: Subject to any disclaimer, the term of this patent is extended or adjusted under 35 U.S.C. 154(b) by 308 days.

(21) Appl. No.: 13/267,043

(22) Filed: Oct. 6, 2011

(65) Prior Publication Data

US 2012/0087040 A1  Apr. 12, 2012

(30) Foreign Application Priority Data

Oct. 6, 2010 (JP) .................................. 2010-226560

(51) Int. Cl.
*G11B 27/36* (2006.01)

(52) U.S. Cl.
USPC .......................................................... 360/133

(58) Field of Classification Search
None
See application file for complete search history.

(56) References Cited

U.S. PATENT DOCUMENTS

| 6,903,886 | B2 * | 6/2005 | Matsuda et al. | 360/15 |
| 7,616,298 | B2 * | 11/2009 | Nakadai | 356/237.1 |
| 2002/0030908 | A1 * | 3/2002 | Matsuda et al. | 360/15 |
| 2006/0092536 | A1 * | 5/2006 | Hayashi | 360/17 |
| 2010/0053790 | A1 * | 3/2010 | Hayashi et al. | 360/31 |
| 2012/0044594 | A1 * | 2/2012 | Meier et al. | 360/31 |

FOREIGN PATENT DOCUMENTS

JP  8-22619  1/1996

* cited by examiner

*Primary Examiner* — Mark Blouin
(74) *Attorney, Agent, or Firm* — Antonelli, Terry, Stout & Kraus, LLP.

(57) ABSTRACT

The present invention provides a magnetic disk inspection method and its system suitable to supply magnetic disks stored in a cassette to a plurality of inspection devices and collects inspected magnetic disks from the inspection devices. The cassette in which uninspected magnetic disks are stored is taken out from a cassette housing unit and transferred to any one of a plurality of optical inspection units. The optical disk inspection unit to which the cassette with the uninspected magnetic disks stored therein is transferred, takes out an uninspected magnetic disk and inspects both surfaces thereof. The magnetic disk whose both surfaces are inspected and which is determined as a non-defective product is stored in a cassette for collecting non-defective magnetic disks. The cassette is transferred from the optical inspection unit to the cassette housing unit. The transferred cassette is housed in the cassette housing unit.

13 Claims, 7 Drawing Sheets

MAGNETIC DISK INSPECTING METHOD AND ITS SYSTEM

BACKGROUND

The present invention relates generally to a magnetic disk inspection method and its system for inspecting a magnetic disk. The invention particularly relates to a magnetic disk inspection method and its system suitable for cassette-transfer, i.e., suitable to put magnetic disks in a cassette and load them to an inspection device and to put inspected magnetic disks in a cassette and take them out.

In a magnetic disk manufacturing line, a defect on the surface of an in-process magnetic disk is optically inspected. In this step, the magnetic disks put in a cassette are loaded into an inspection device, which takes out the magnetic disks one by one from the cassette and inspects them. The inspection device then returns the inspected magnetic disks to the cassette and transfers them to the next step.

As described above, magnetic disks are put in a cassette and taken in and out of an inspection device. In this respect, for example, JP-A-8-22619 (Patent Document 1) describes the fact that the inspection device takes out the magnetic disks one by one from the cassette for inspection, divides the inspected magnetic disks into non-defective products and defective products and stores them in corresponding separate cassettes.

The magnetic disk inspection device described in Patent Document 1 is configured as below. The magnetic disk inspection device takes out magnetic disks from a cassette and sequentially shifts the magnetic disks among a plurality of inspection means for performing a plurality of respective inspections. In addition, after a series of the inspections have been finished, the inspection device stores the magnetic disks in corresponding collection cassettes.

However, a plurality of inspection devices not necessarily can inspect a single magnetic disk at the same throughput. In some inspection step, the plurality of inspection devices may have to be used for inspections in accordance with a difference in throughput among the inspection devices.

Patent Document 1 does not consider the case where if a plurality of the same inspection devices are used for inspection as described above, a magnetic disk is loaded from a cassette to the inspection devices.

SUMMARY

The present invention provides a method for inspecting a magnetic disk by use of the same inspection devices, and its system, which method and system are suitable to load a magnetic disk stored in a cassette to each of the inspection devices and recover an inspected magnetic disk from each of the inspection devices.

According to an aspect of the present invention, there is provided a magnetic disk inspection system including: a plurality of optical inspection units; a cassette supply and collection unit that transfers a cassette in which an uninspected magnetic disk is stored, to the plurality of optical inspection units, and collects a cassette in which a magnetic disk inspected by the plurality of optical inspection units is stored; a cassette housing unit that houses the cassette in which the uninspected magnetic disk is stored and the cassette in which the inspected magnetic disk is stored; and a disk handling unit that takes out a magnetic disk from the cassette in which the uninspected magnetic disk is stored and which is transferred by the cassette supply and collection unit, loads the magnetic disk to the optical inspection unit, and then stores the magnetic disks inspected by the optical inspection units in the corresponding cassettes in such a manner that the magnetic disks are delivered to the cassettes responsive to results of the inspection, wherein the cassette supply and collection unit works as: taking out at least one of the cassette in which the uninspected magnetic disk is stored and an empty cassette for storing inspected magnetic disk, from the cassette housing unit; transferring the took out cassette to any one of the plurality of optical inspection units; taking out, from any one of the plurality of optical inspection units, at least one of an empty cassette from which an uninspected magnetic disk has been taken out and a cassette in which a magnetic disk determined as a non-defective product among the inspected magnetic disks is stored; and transferring the took out cassette to the cassette housing unit.

According to another aspect of the present invention, there is provided a magnetic disk inspection method including the steps of: taking out, from a cassette housing unit, a cassette in which an uninspected magnetic disk is stored and transferring the cassette to any one of a plurality of optical inspection units; taking out the uninspected magnetic disk stored in the transferred cassette at the optical inspection unit to which the cassette with the uninspected magnetic disk stored therein is transferred and inspecting both surfaces of the magnetic disk by the optical inspection unit; storing a magnetic disk whose both surfaces have been inspected and which has been determined as a non-defective product, in a cassette for collecting a non-defective magnetic disk; transferring the cassette in which the non-defective magnetic disk is stored, from the optical inspection unit to the cassette housing unit; and housing in the cassette housing unit the transferred cassette in which the non-defective magnetic disk is stored.

According to another aspect of the present invention, there is provided a magnetic disk inspection method including the steps of: taking out a cassette in which an uninspected magnetic disk is stored, from a cassette housing unit and transferring the cassette to any one of a plurality of optical inspection units by a transfer unit; taking out the uninspected magnetic disk from the transferred cassette in which the uninspected magnetic disk is stored and inspecting both surfaces of the magnetic disk by each of the plurality of optical inspection units; storing in a cassette for collecting a non-defective magnetic disk, a magnetic disk whose both surfaces have been inspected and which has been determined as a non-defective product by each of the plurality of inspection units; and transferring the non-defective magnetic disk collection cassette in which the non-defective magnetic disk is stored, to the cassette housing unit by the transfer unit and housing the non-defective magnetic disk collection cassette in the cassette housing unit, wherein the step of transferring a cassette to any one of the plurality of optical inspection units by the transfer unit and the step of inspecting both the surfaces of the magnetic disk by each of the plurality of optical inspection units are performed in parallel to each other to continuously perform the inspection on the uninspected magnetic disks without stopping the operation of the plurality of optical inspection units.

The present invention makes it possible to continuously perform the inspections on magnetic disks without lowering the throughput of the inspection system. In addition, because of the provision of the shuttle transfer portion, even if the number of the inspection units is increased or decreased, it is possible to continuously perform the inspections on magnetic disks without lowering the throughput of the inspection system.

These features and advantages of the invention will be apparent from the following more particular description of preferred embodiments of the invention, as illustrated in the accompanying drawings.

DESCRIPTION OF THE PREFERRED EMBODIMENTS

Preferred embodiments of the present invention will hereinafter be described with reference to the drawings.

Figure 1:
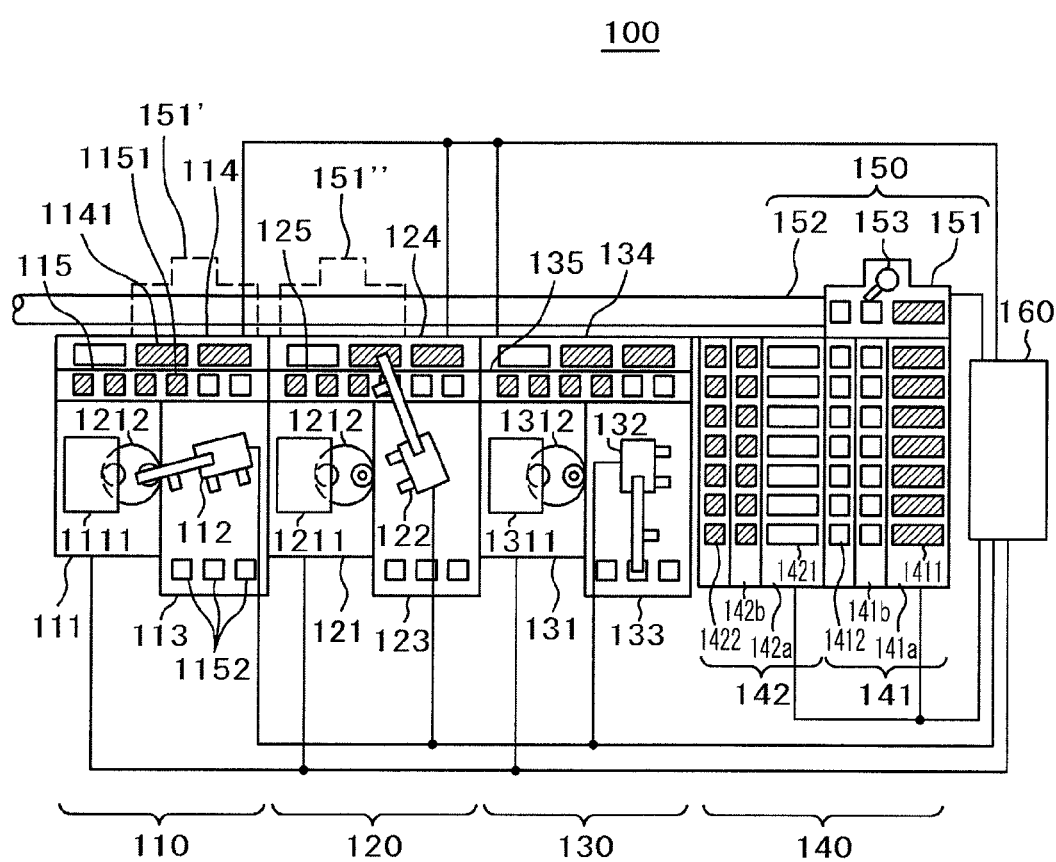
FIG. 1 illustrates a schematic configuration of an overall magnetic disk inspection system according to an embodiment.

FIG. 1 illustrates a schematic configuration of a magnetic disk inspection system 100 according to an embodiment. The magnetic disk inspection system 100 according to the embodiment includes an inspection unit A 110, an inspection unit B 120, an inspection unit C 130, a cassette stocker portion 140, a shuttle transfer portion 150, and an overall control portion 160.

The inspection unit A 110 includes an optical inspection portion A 111, a disk transfer portion A 113 provided with a disk transfer robot A 112, an uninspected disk cassette transfer portion A 114, and an inspected disk storing cassette transfer portion A 115.

The inspection unit B 120 includes an optical inspection portion B 121, a disk transfer portion B 123 provided with a disk transfer robot B 122, an uninspected disk cassette transfer portion B 124, and an inspected disk storing cassette transfer portion B 125.

The inspection unit C 130 includes an optical inspection portion C 131, a disk transfer portion C 133 provided with a disk transfer robot C 132, an uninspected disk cassette transfer portion C 134, and an inspected disk storing cassette transfer portion C 135.

The cassette stocker portion 140 includes a supply cassette housing portion 141 and a collected cassette housing portion 142. The supply cassette housing portion 141 houses cassettes 1411 in which uninspected magnetic disks are stored, and cassettes 1412 for storing inspected magnetic disks. The collected cassette housing portion 142 houses cassettes 1421 getting empty after uninspected magnetic disks have been loaded to any one of the inspection units A, B, C: 110, 120, 130; and inspected magnetic disk housing cassettes 1422 in which magnetic disks inspected by any one of the inspection units A, B, C: 110, 120, 130 are stored.

The shuttle transfer portion 150 includes a table 151, a guide rail 152 and a cassette handling unit 153. The table 151 is configured to be driven by a drive source, not shown, to be movable along the guide rail 152. The cassette handling unit 153 is fixed to the table 151 and delivers and receives the cassettes 1411, 1412, 1421, 1422 between the cassette stocker portion 140 and the table 151, and between the inspection units A, B, C: 110, 120, 130 and the table 151.

The overall control portion 160 is connected to the inspection unit A 110, the inspection unit B 120, the inspection unit C 130, the cassette stocker portion 140, and the shuttle transfer portion 150 for controlling their operations.

Detailed configurations of the optical inspection portions A, B, C: 111, 121, 131 of the inspection units A, B, C: 110, 120, 130, and of the disk transfer robots A, B, C: 112, 122, 132 are described with reference to FIGS. 2A, 2B and 2C. The optical inspection portions A, B, C: 111, 121, 131 have the same configuration; therefore, the configuration of the optical inspection portion A 111 is described as the representative of them. In addition, the disk transfer robots A, B, C: 112, 122, 132 have the same configuration; therefore, the configuration of the disk transfer robot A 112 is described as the representative of them.

Figure 2A:
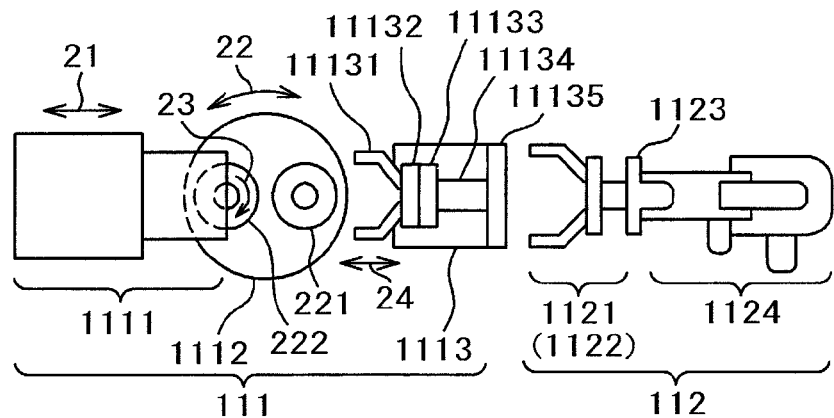
FIG. 2A is a plan view of an optical inspection portion and a disk transfer robot.

FIG. 2A is a plan view of the optical inspection portion A 111 of the inspection unit A 110 and of the disk transfer robot A 112. The optical inspection portion A 111 includes an optical inspection unit 1111, a turn table portion 1112 and a disk inverse unit 1113. The disk transfer robot A 112 includes an upper chuck portion 1121, a lower chuck portion 1122, a support portion 1123 supporting (securing) the upper chuck portion 1121 and the lower chuck portion 1122, and an articulated robot portion 1124.

Figure 2B:
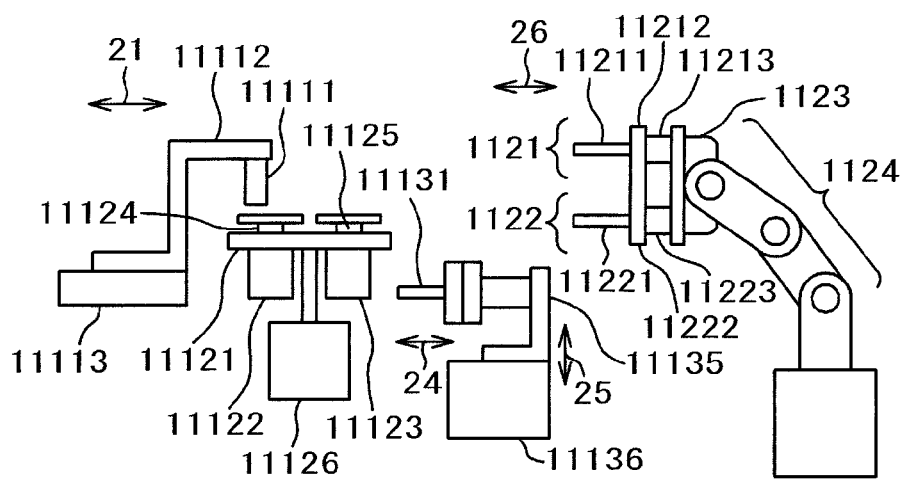
FIG. 2B is a front view of the optical inspection portion and the disk transfer robot.

FIG. 2B is a front view of the optical inspection portion A 111 of the inspection unit A 110 and of the disk transfer robot A 112. The optical inspection unit 1111 of the optical inspection portion A 111 includes an optical inspection system portion 11111, an inspection optical system support portion 11112, and a table portion 11113. The table portion 11113 moves the inspection optical system support portion 11112 fixed to the table portion 11113 in a direction of arrow 21 shown in FIG. 2A.

The turn table portion 1112 of the optical inspection portion A 111 includes a turn table 11121, motors 11122, 11123 fixed to the turn table 11121, a spindle 11124 which is driven to rotate by the motor 11122, a spindle 11125 which is driven to rotate by the motor 11123, and a drive motor 11126 turnably driving the turn table 11121.

Figure 2C:
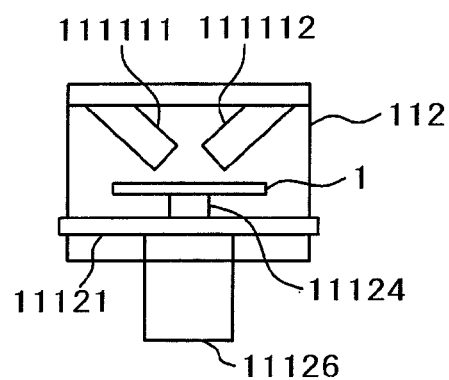
FIG. 2C is a front view illustrating a schematic configuration of an optical inspection unit.

FIG. 2C illustrates a configuration of the optical inspection system portion 11111. The optical inspection system portion 11111 includes an illumination optical system 111111 adapted to emit light to a magnetic disk 1 (a magnetic disk) as an inspection object mounted on the spindle 11124, and a detection optical system 111112 adapted to detect light reflected from the magnetic disk 1 irradiated with light from the illumination optical system 111111.

The disk inverse unit 1113 includes a chuck portion 11131 holding the magnetic disk 1; an opening-closing drive portion 11132 drivingly opening and closing the chuck portion 11131 to hold the magnetic disk 1; and a turn drive portion 11133 half-turning the chuck portion 11131 to inverse the magnetic disk 1. The disk inverse unit 1113 further includes a back and forth drive portion 11134 driving the chuck portion 11131 in a back and forth direction denoted with arrow 24; a support portion 11135 supporting (securing) the back and forth drive portion 11134; and a vertical drive table 11136 putting the support portion 11135 thereon and driving it in a vertical direction denoted with arrow 25.

The upper chuck portion 1121 of the disk transfer robot A 112 includes a chuck portion 11211 holding the magnetic disk 1; an opening-closing drive portion 11212 driving the chuck portion 11211 to open and close to hold the magnetic disk 1; and a back and forth drive portion 11213 driving the chuck portion 11211 in a back and forth direction denoted with arrow 26. The back and forth drive portion 11213 is supported (secured) by the support portion 1123. Similarly to the upper chuck portion 1121, also the lower chuck portion 1122 includes a chuck portion 11221 holding the magnetic disk 1; an opening-closing drive portion 11222 drivingly opening and closing the chuck portion 11221 to hold the magnetic disk 1; and a back and forth drive portion 11223 driving the chuck portion 11221 in a back and forth direction denoted with arrow 26. The back and forth drive portion 11223 is supported (secured) by the support portion 1123.

Figure 3:
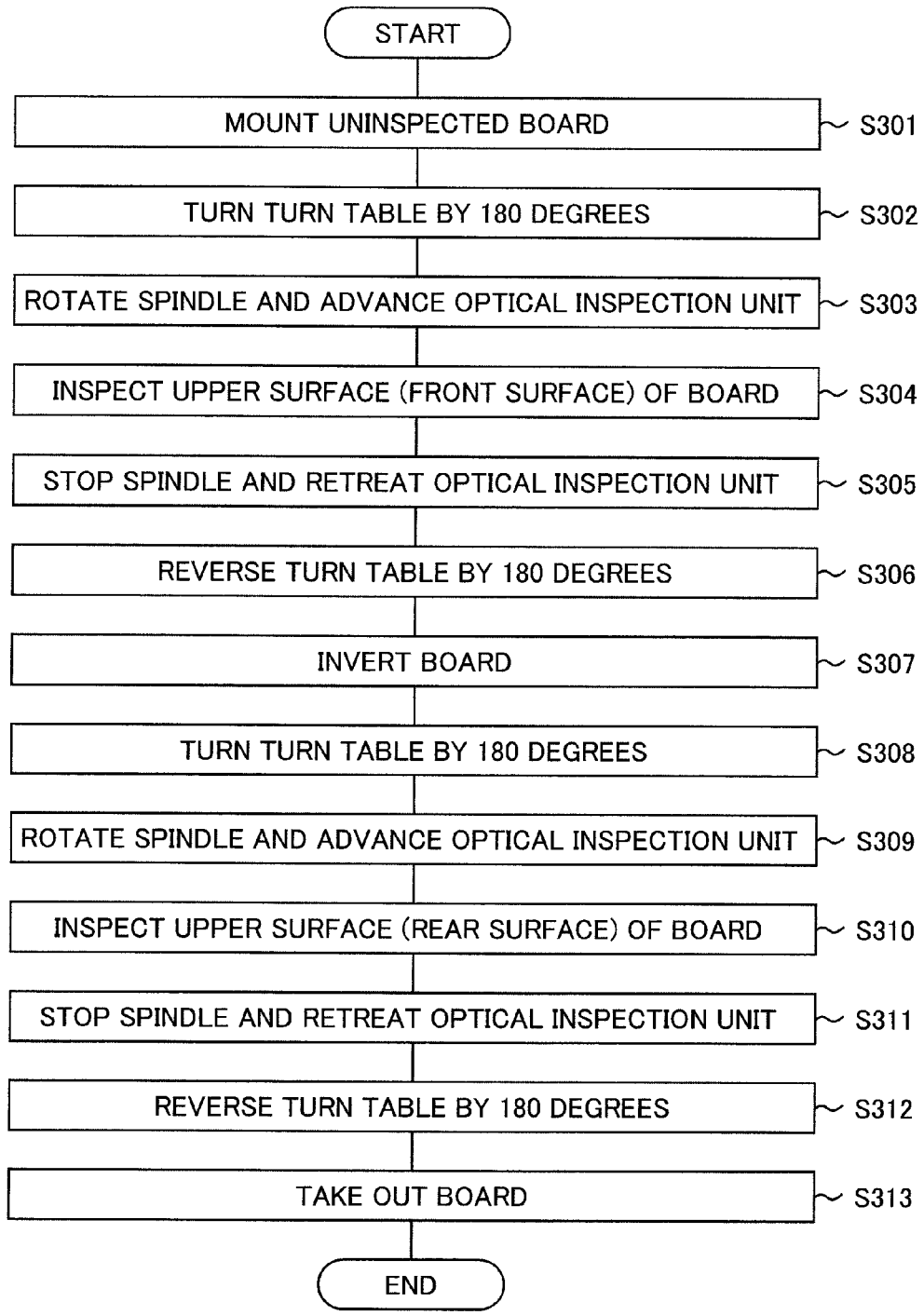
FIG. 3 is a flowchart illustrating a flow of inspection performed in the optical inspection portion.

A flow of inspection performed by the optical inspection portion 111 in the configuration described above is described below with reference to FIG. 3.

The disk transfer robot A 112 takes out a magnetic disk from an uninspected disk cassette to be described later by use of the lower chuck portion 1122, and mounts it on the spindle 11125 stopping at a position 221 of the turn table 11121 (S301). The turn table 11121 that has received the magnetic disk 1 is turned by 180 degrees so that the spindle 11125 that has received the magnetic disk 1 is stopped at a position 222 (S302). In this state, the spindle 11125 is driven to rotate in the right direction denoted with arrow 23 by the motor 11123 to rotate the magnetic disk 1, and the optical inspection system portion 11111 is moved at a constant speed in the direction of arrow 21 by the table portion 11113 (S303). The detection optical system 111112 detects light reflected from the magnetic disk 1 irradiated with light from the illumination optical system 111111, and the overall control portion 160 processes the signal thus detected and detects a defect on the magnetic disk 1.

After the inspection of the upper surface of the magnetic disk 1 has been finished, the optical inspection system portion 11111 is moved in the left direction denoted with arrow 21 to retreat from the turn table 1112 and the rotation of the spindle 11125 is then stopped (S305). The turn table 1112 is reversed by 180 degrees to return the magnetic disk 1 whose upper surface has been inspected from the position 222 to the position 221 (S306).

The disk inverse unit 1113 is next used to inverse the magnetic disk 1 whose upper surface has been inspected (S307). The inverse action of the magnetic disk is as below. The vertical drive table 11136 of the disk inverse unit 1113 is first driven to raise the chuck portion 11131 to a height equal to that of the magnetic disk 1 mounted on the spindle 11125. The back and forth drive portion 11134 is next operated to advance the chuck portion 11131 and the opening-closing drive portion 11132 is operated at the position where the magnetic disk 1 is mounted on the spindle 11125, to close the chuck portion 11131 to hold the magnetic disk 1. The vertical drive table 11136 is then driven to raise the chuck portion 11131 to remove the magnetic disk 1 from the spindle 11125. When the chuck portion 11131 is raised to a certain height, the vertical drive table 11136 is stopped and the turn drive portion 11133 is turned by 180 degrees to inverse the magnetic disk 1 to turn the uninspected surface upward. The vertical drive table 11136 is next driven to lower the chuck portion 11131 and the inversed magnetic disk 1 is mounted on the spindle 11125. Further, the opening-closing drive portion 11132 is operated to open the chuck portion 11131 to release the holding of the 1. Thereafter, the back and forth drive portion 11134 is operated to retreat the chuck portion 11131 and the vertical drive table 11136 is then driven to lower the chuck portion 11131 to a standby position.

The turn table 1112 is next turned by 180 degrees to move the spindle 11125 on which the inversed magnetic disk 1 is mounted (S308) to the position 222. The same operation from step S303 to step S306 is next repeated (S309 to S312). The upper chuck portion 1121 of the disk transfer robot 112 holds the magnetic disk 1 whose both surfaces have been inspected, removes it from the spindle 11125 (S313) and stores it in an inspected disk storing cassette to be described later.

The disk transfer robot 112 of the inspection unit A holds and takes out an uninspected magnetic disk from a cassette 1411 of the uninspected disk cassette transfer portion 114 shown in FIG. 1 by use of the chuck portion 11221 of the lower chuck portion 1122. As described above, the magnetic disk 1 whose both surfaces have been inspected by the optical inspection unit 1111 is transferred to the position 221 by the turn table 1112. Next, the transferred magnetic disk 1 is held and raised by the chuck portion 11211 of the upper chuck portion 1121 to be removed from the spindle 11125 (or 11124). An uninspected magnetic disk held by the chuck portion 11221 of the lower chuck portion 1122 is mounted on the spindle 11125 (or 11124). The spindle 11125 (or 11124) on which the uninspected magnetic disk is mounted is turned by 180 degrees by the turn table to move to the position 222, in which the uninspected magnetic disk is inspected by the optical inspection unit 1111.

The disk transfer robot 112 holds, by use of the chuck portion 11211 of the upper chuck portion 1121, the magnetic disk 1 whose both surfaces have been inspected and stores the magnetic disk 1 in a cassette in accordance with the inspection result of the magnetic disk 1. More specifically, if the magnetic disk 1 is determined as a non-defective product because of no defect on both the surfaces of the magnetic disk 1, it is stored in an inspected disk storing cassette 1151 on the inspected disk storing cassette transfer portion A 115. If a defect is detected on one of or both the surfaces of the magnetic disk 1, the magnetic disk 1 is stored in a defect disk collection cassette 1152.

The shuttle transfer portion 150 is next described with reference to FIGS. 4A and 4B.

The cassette handling unit 153 includes a cassette chuck portion 1531 chucking a cassette; a chuck opening-closing drive portion 1532 for driving the opening-closing action of the cassette chuck portion 1531; and a chuck turn control portion 1533 for controlling the turn-directional position of the cassette chuck portion 1531. The cassette handling unit 153 further includes an arm portion 1534 for supporting the chuck turn control portion 1533; an arm drive portion 1535 for driving the arm portion 1534 back and forth; and a vertical drive portion 1536 for vertically driving the arm drive portion 1535 to change the height of the cassette chuck portion 1531. The vertical drive portion 1536 is mounted on the table 151 and shifted together with the table 151 along the guide rail 152.

Figure 4A:
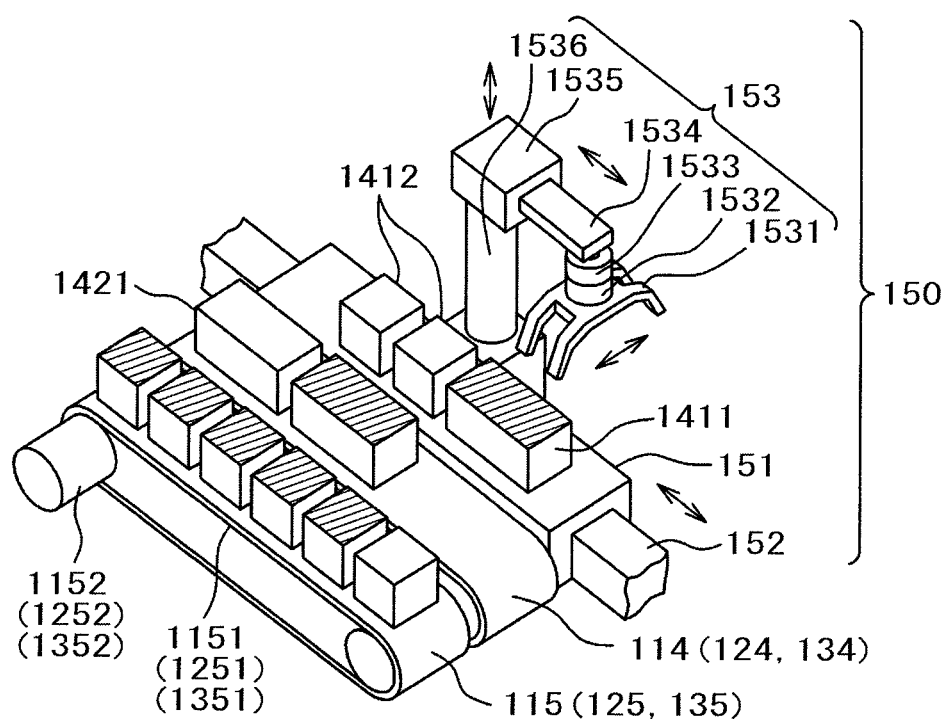
FIG. 4A is a perspective view of a shuttle transfer portion and a cassette transfer portion of the inspection unit, illustrating a state before an uninspected magnetic disk storing cassette will be taken out from a table.
Figure 4B:
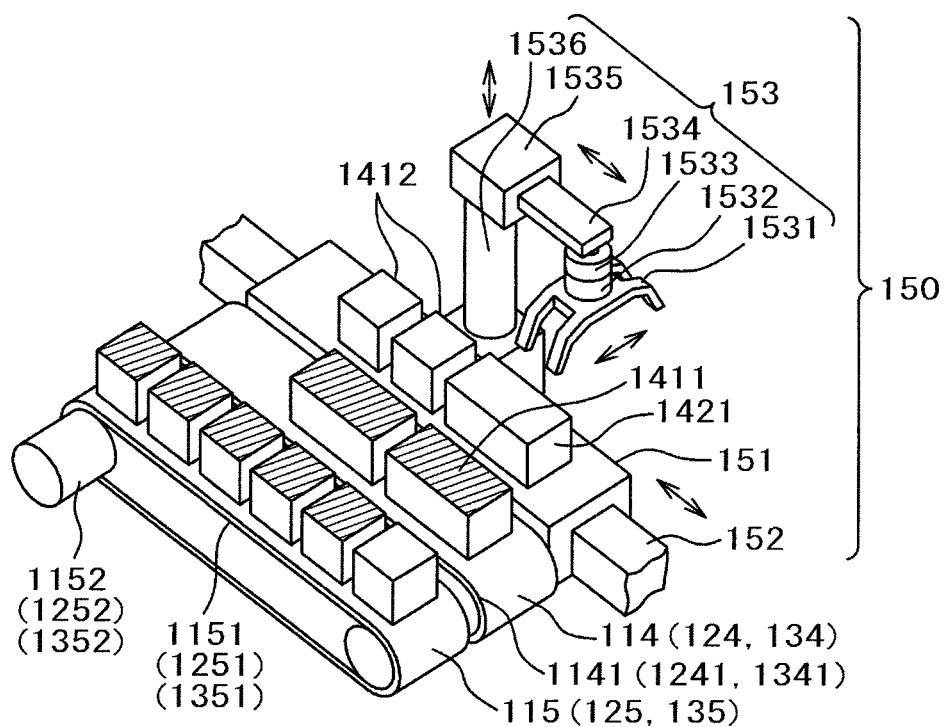
FIG. 4B is a perspective view of the shuttle transfer portion and the cassette transfer portion of the inspection unit, illustrating a state where a cassette handling unit transfers an uninspected magnetic disk storing cassette to an uninspected-disk cassette transfer portion and the storing cassette that stores no uninspected magnetic disks is transferred onto the table.

FIG. 4A illustrates a state where the uninspected magnetic disk storing cassette 1411 is mounted on the table 151 before transfer. FIG. 4B illustrates a state as below. The cassette handling unit 153 transfers the uninspected magnetic disk storing cassette 1411 from the table 151 to the uninspected disk cassette transfer portion 114. In addition, the cassette handling unit 153 transfers a storing cassette 1421 in which no uninspected magnetic disk is stored, from the uninspected disk cassette transfer portion 114 onto the table 151. The number of magnetic disks the uninspected magnetic disk storing cassette 1411 can store is greater than that of the cassette 1151 for storing the inspected non-defective magnetic disks can store.

The operation of the shuttle transfer portion 150 is next described with reference to FIGS. 4A, 4B and 5.

The table 151 of the shuttle transfer portion 150 is first moved to the supply cassette housing portion 141 of the cassette stocker portion 140 (S501). Then, the cassette handling unit 153 mounted on the table 151 is used to take out the cassette 1411 in which uninspected magnetic disks are stored, from the supply cassette housing portion 141 and transfer it onto the table 151 (S502). The cassette handling unit 153 is used to take out the cassette 1412 for storing inspected magnetic disks from the supply cassette housing portion 141 and transfer it onto the table 151 (S503).

The table 151 moves to an inspection unit among the inspection units A, B, C: 110, 120, 130 which has no cassette 1411 filled with uninspected disks (for example, to a position denoted with a dotted line 151' in FIG. 1 assuming that the inspection unit A does not store the cassette 1411 which is filled with uninspected disks) (S504). The cassette handling unit 153 takes out the uninspected magnetic disk storing cassette 1411 transferred by the table 151 and mounts it onto the uninspected disk cassette transfer portion A 114 of the inspection unit A (S505). The cassette handling unit 153 takes out the uninspected magnetic disk storing cassette 1421 from the uninspected disk cassette transfer portion A 114 and transfers it onto the table 151 for collecting (S506). Such an uninspected disk storing cassette 1421 is empty resulting from all magnetic disks taken out therefrom for inspection at the inspection unit A. The uninspected disk cassette transfer portion A 114 mounts the uninspected magnetic disk storing cassette 1411 onto a belt 1141, which is driven by a motor (not shown) to transfer the cassette.

Then, the table 151 moves to an inspection unit (which is assumed as the inspection unit B) at which the inspected disk collection cassette 1412 with the inspected non-defective disks stored therein exists (S507). The cassette handling unit 153 takes out the inspected magnetic disk collection cassette 1412 transferred by the table 151 and mounts it onto the inspected disk storing cassette transfer portion B 125 of the inspection unit B (S508). The cassette handling unit 153 takes out the inspected magnetic disk collection cassette 1412 in which the inspected non-defective magnetic disks are stored, from the inspected disk storing cassette transfer portion B125 of the inspection unit B and transfers it onto the table 151 (S509). The inspected disk cassette transfer portion B 125 mounts the inspected disk storing cassette 1412 onto a belt 1251, which is driven by a motor 1252 to transfer the cassette.

The table 151 collects the uninspected magnetic disk storing cassette 1421 having gotten empty and the inspected magnetic disk collection cassette 1412 in which the inspected non-defective magnetic disks are stored. Such a table 151 is next moved along the guide rail 152 to in front of the collected cassette housing portion 142 of the cassette stocker portion 140 (S510). At the position of the collected cassette housing portion 142, the cassette handling unit 153 takes out the uninspected magnetic disk storing cassette 1421 having gotten empty from the table 151 and transfers it to the collected cassette housing portion 142 (S511). The cassette handling unit 153 next takes out the inspected magnetic disk collection cassette 1412 filled with the inspected non-defective magnetic disks from the table 151 and transfers it to the collected cassette housing portion 142 (S512).

The operation of the shuttle transfer portion described above is one example. The inspection unit to which the cassette 1421 for storing the uninspected magnetic disks is supplied may be one and the same as the inspection unit to which the cassette 1412 collecting the inspected non-defective magnetic disks is supplied. In this case, step S507 is eliminated. Alternatively, the following may be acceptable. The uninspected magnetic disk storing cassette 1421 having gotten empty is recovered and then transferred to the collected cassette housing portion 142 temporarily. Thereafter, the table 151 is shifted to any one of the inspection units, from which the inspected magnetic disk collection cassette 1412 filled with the inspected magnetic disks is recovered and to which the inspected magnetic disk collection cassette 1412 having gotten empty is supplied.

Figure 5:
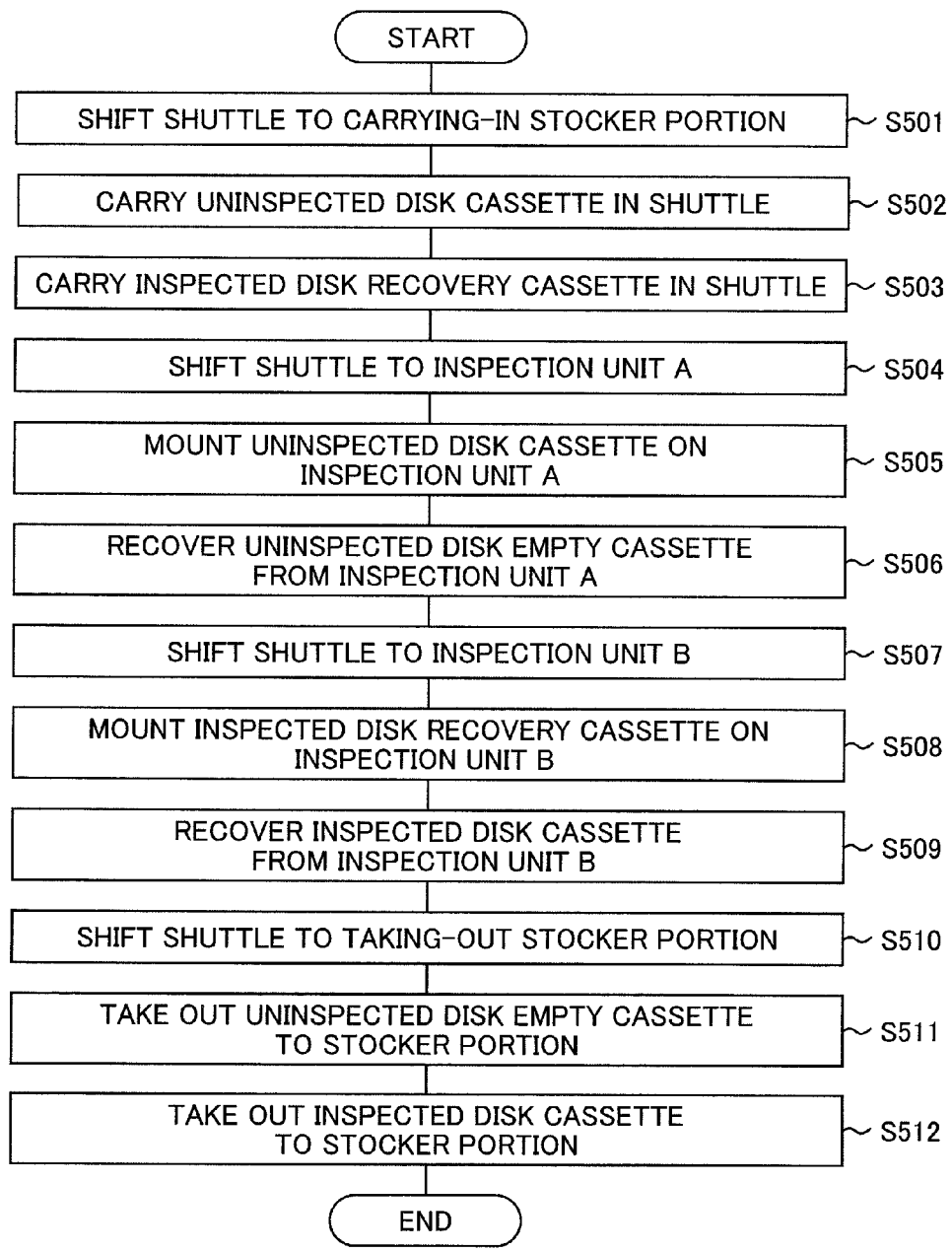
FIG. 5 is a flowchart illustrating a procedure in which the shuttle transfer portion transfers cassettes.

In the flowchart shown in FIG. 5, the cassette 1421 for storing uninspected magnetic disks is mounted onto the table 151 in step S502. Thereafter, the inspected magnetic disk collection cassette 1412 is mounted onto the table 151 in step S503. However, it also may be possible to any one of the cassettes be mounted onto the table 151 and transferred to the inspection unit.

Further, in step S506, the empty cassette for uninspected disks is collected, and in step S509, the cassette in which the inspected non-defective magnetic disks are stored is collected, thereafter in the step S510, the table 151 of the shuttle transfer portion 150 is returned to the collected cassette housing portion 142. Alternatively, any one of steps S506 and S509 may be omitted and only one of the cassettes may be returned to the collected cassette housing portion 142.

Figure 6A:
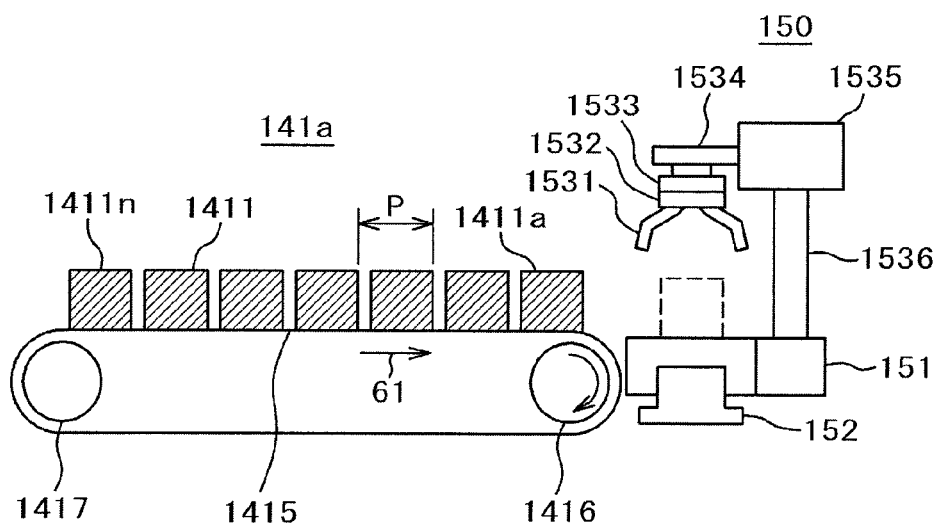
FIG. 6A is a lateral view of a housing portion 141a of a supply cassette housing portion and the shuttle transfer portion.

FIG. 6A is a lateral view illustrating, of the supply cassette housing portion 141 of the cassette stocker portion 140, a housing portion 141a housing the cassette 1411 in which uninspected magnetic disks are stored, and the shuttle transfer portion 150. The supply cassette housing portion 141a mounts, on the belt 1415, the cassettes 1411 in which uninspected magnetic disks are stored and transfers them. The belt 1415 is wound around a belt drive shaft portion 1416 and a roller 1417. A leading cassette 1411a on the belt 1415 is taking out and transferred to the table 151 of the shuttle transfer portion 150 by the cassette handling unit 153 of the shuttle transfer portion 150, so that the belt 1415 is shifted at a pitch P in a direction of arrow 61 by the belt drive shaft portion 1416. In addition, a new cassette 1411n+1 in which uninspected magnetic disks are stored, are supplied on the back of the last cassette 1411n by a transfer means (not shown).

Figure 6B:
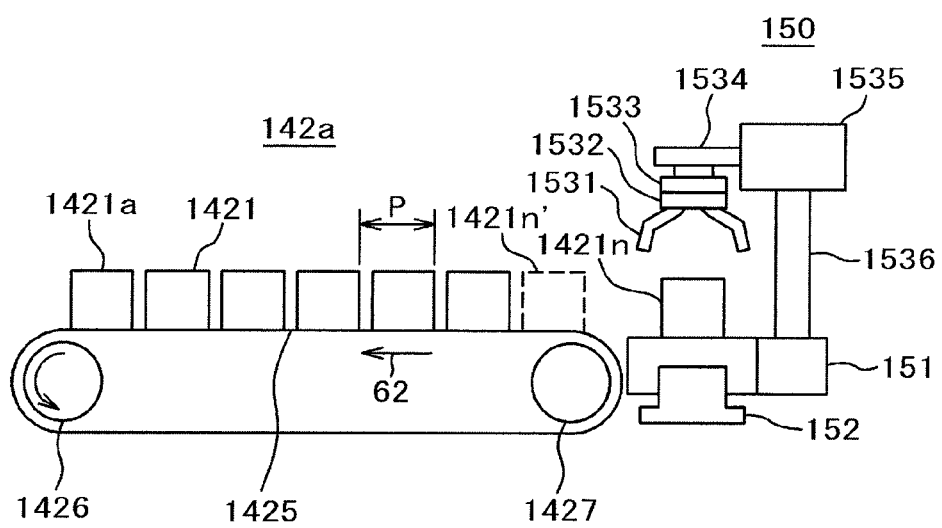
FIG. 6B is a lateral view of a housing portion 142a of a supply cassette housing portion and the shuttle transfer portion.

FIG. 6B is a lateral view illustrating, of the collected cassette housing portion 142 of the cassette stocker portion 140, a housing portion 142a collecting the empty uninspected magnetic disk storing cassettes 1421, and the shuttle transfer portion 150. The collected cassette housing portion 142a mounts the empty uninspected magnetic disk storing cassettes 1421 collected from any one of the inspection units A, B, C: 110, 120, 130 on the belt 1425 and transfers it. The belt 1425 is wound around a belt drive shaft portion 1426 and a roller 1427. An empty uninspected magnetic disk storing cassette 1421n taken out from the table 151 by the cassette handling unit 153 of the shuttle transfer portion 150 is mounted at a position 1421n' denoted with a dotted line on the belt 1425. The empty uninspected magnetic disk storing cassette 1421n is mounted on the belt and a leading empty uninspected magnetic disk storing cassette 1421a is taken out from the belt 1425 by a pick up means (not shown), so that the belt 1425 is driven by the belt drive shaft portion 1426 to shift at a pitch P in a direction of arrow 62.

Although not shown, a housing portion 141b housing the inspected magnetic disk collection cassette 1412 of the supply cassette housing portion 141 of the cassette stocker portion 140 has the same configuration as that of the housing portion 141a. The housing portion 141b is different from the housing portion 141a in transfer pitch P in accordance with a difference in size between the inspected magnetic disk collection cassette 1412 and the uninspected magnetic disk storing cassette 1411.

A housing portion 142b, housing the inspected magnetic disk collection cassettes 1422, of the collected cassette housing portion 142 has the same configuration as that of the housing portion 142a. The housing portion 142b is different from the housing portion 142a in transfer pitch P in accordance with a difference in size between the inspected magnetic disk collection cassette 1422 and the uninspected magnetic disk storing cassette 1421.

According to the configuration described above, the inspection system 100 provided with the plurality of inspection units 110, 120, 130 to inspect magnetic disks in parallel with one another includes the cassette stocker portion 140 capable of housing a plurality of cassettes, and the shuttle transfer portion 150 mounting the cassette thereon and going back and forth between the stocker portion 140 and each of the inspection units 110, 120, 130. Therefore, while the plurality of inspection units perform inspections on associated magnetic disks, the uninspected magnetic disk storing cassette 1421 can be supplied during the continuous inspection without stopping the operation of each of the inspection units and the inspected magnetic disk collection cassette 1412 filled with the inspected magnetic disks can be collected.

In this way, the inspection system 100 can continuously perform inspection on magnetic disks without lowering its throughput. Because of installing the shuttle transfer portion 150, even if the number of the inspection units is increased or decreased, the inspection system 100 can continuously perform the inspection on the magnetic disks without lowering the throughput of the inspection system 100.

The invention made by the inventor has specifically been described thus far based on the embodiment. However, the invention is not limited to the embodiment but can be modified in various ways in a range not departing from the gist of the invention.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

The invention claimed is:

1. A magnetic disk inspection system comprising:
   a plurality of optical inspection units;
   a cassette supply and collection unit that transfers a cassette in which an uninspected magnetic disk is stored, to the plurality of optical inspection units, and collects a cassette in which a magnetic disk inspected by the plurality of optical inspection units is stored;
   a cassette housing unit that houses the cassette in which the uninspected magnetic disk is stored and the cassette in which the inspected magnetic disk is stored; and
   a disk handling unit that takes out a magnetic disk from the cassette in which the uninspected magnetic disk is stored and which is transferred by the cassette supply and collection unit, loads the magnetic disk to the optical inspection unit, and then stores the magnetic disks inspected by the optical inspection units in the corresponding cassettes in such a manner that the magnetic disks are delivered to the cassettes responsive to results of the inspection,
   wherein the cassette supply and collection unit works as:
   taking out at least one of the cassette in which the uninspected magnetic disk is stored and an empty cassette for storing inspected magnetic disk, from the cassette housing unit;
   transferring at least one of the cassettes to any one of the plurality of optical inspection units;
   taking out, from any one of the plurality of optical inspection units, at least one of an empty cassette from which an uninspected magnetic disk has been taken out and a cassette in which a magnetic disk determined as a non-defective product among the inspected magnetic disks is stored; and
   transferring the took out cassette to the cassette housing unit.

2. The magnetic disk inspection system according to claim 1, wherein the cassette supply and collection unit concurrently transfers a plurality of cassettes including the cassette in which an uninspected magnetic disk is stored and the empty cassette for storing an inspected magnetic disk.

3. The magnetic disk inspection system according to claim 1, wherein the cassette housing unit includes:
   a supply cassette housing portion that houses the cassette in which an uninspected magnetic disk is stored and the empty cassette for storing an inspected non-defective magnetic disk; and
   a collected cassette housing portion that houses a cassette from which all the uninspected magnetic disks have been taken out and which has gotten empty, and a cassette for storing an inspected non-defective magnetic disk.

4. The magnetic disk inspection system according to claim 1, wherein the disk handling unit stores a magnetic disk determined as a defective product among the magnetic disks inspected by the optical inspection units, in a cassette different from the cassette in which the magnetic disk that is determined as the non-defective product and recovered by the cassette supply and collection unit is stored.

5. The magnetic disk inspection system according to claim 1, wherein the cassette for storing an uninspected magnetic disk is greater in the number of stored magnetic disks than the cassette for storing an inspected non-defective magnetic disk.

6. A magnetic disk inspection method comprising the steps of:
   taking out, from a cassette housing unit, a cassette in which an uninspected magnetic disk is stored and transferring the cassette to any one of a plurality of optical inspection units;
   taking out the uninspected magnetic disk stored in the transferred cassette at the optical inspection unit to which the cassette with the uninspected magnetic disk stored therein is transferred and inspecting both surfaces of the magnetic disk by the optical inspection unit;
   storing a magnetic disk whose both surfaces have been inspected and which has been determined as a non-defective product, in a cassette for collecting a non-defective magnetic disk;
   transferring the cassette in which the non-defective magnetic disk is stored, from the optical inspection unit to the cassette housing unit; and housing in the cassette housing unit the transferred cassette in which the non-defective magnetic disk is stored.

7. The magnetic disk inspection method according to claim 6, wherein in the step of transferring the cassette in which the uninspected magnetic disk is stored, to any one of the optical inspection units, also an empty cassette for storing an inspected non-defective magnetic disk is taken out from the cassette housing unit and is transferred to any of the plurality of optical inspection units.

8. The magnetic disk inspection method according to claim 6, wherein in the step of transferring the cassette in which the non-defective magnetic disk is stored, from the optical inspection unit to the cassette housing unit, also a cassette from which all the stored uninspected magnetic disks have been taken out and which has gotten empty is transferred from the optical inspection unit to the cassette housing unit.

9. The magnetic disk inspection method according to claim 6, wherein a magnetic disk that is determined as a defective product among the magnetic disks inspected by the optical inspection unit, is stored in a cassette different from the cassette in which the magnetic disk determined as the non-defective product is stored.

10. A magnetic disk inspection method comprising the steps of:
taking out a cassette in which an uninspected magnetic disk is stored, from a cassette housing unit and transferring the cassette to any one of a plurality of optical inspection units by a transfer unit;
taking out the uninspected magnetic disk from the transferred cassette in which the uninspected magnetic disk is stored and inspecting both surfaces of the magnetic disk by each of the plurality of optical inspection units;
storing in a cassette for collecting a non-defective magnetic disk, a magnetic disk whose both surfaces have been inspected and which has been determined as a non-defective product by each of the plurality of inspection units; and
transferring the non-defective magnetic disk collection cassette in which the non-defective magnetic disk is stored, to the cassette housing unit by the transfer unit and housing the non-defective magnetic disk collection cassette in the cassette housing unit,
wherein the step of transferring a cassette to any one of the plurality of optical inspection units by the transfer unit and the step of inspecting both the surfaces of the magnetic disk by each of the plurality of optical inspection units are performed in parallel to each other to continuously perform the inspection on the uninspected magnetic disks without stopping the operation of the plurality of optical inspection units.

11. The magnetic disk inspection method according to claim 10, wherein in the step of transferring the cassette in which an uninspected magnetic disk is stored, to any one of the optical inspection units, also an empty cassette for storing an inspected non-defective magnetic disk is taken out from the cassette housing unit and transferred to any one of the plurality of optical inspection units.

12. The magnetic disk inspection method according to claim 10, wherein in the step of transferring the cassette in which a non-defective magnetic disk is stored, from the optical inspection unit to the cassette housing unit, also a cassette from which all the stored uninspected magnetic disks have been taken out and which has gotten empty is transferred from the optical inspection unit to the cassette housing unit.

13. The magnetic disk inspection method according to claim 10, wherein a magnetic disk that is determined as a defective product among the magnetic disks inspected by the optical inspection unit, is stored in a cassette different from the cassette in which the magnetic disk determined as the non-defective product is stored.

* * * * *